(12) United States Patent
Hosokawa et al.

(10) Patent No.: US 6,901,093 B2
(45) Date of Patent: May 31, 2005

(54) SEMICONDUCTOR LASER DEVICE

(75) Inventors: Yasunori Hosokawa, Nagasaki (JP); Kenji Ohgiyama, Nagasaki (JP); Makoto Kanda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 36 days.

(21) Appl. No.: 10/452,517

(22) Filed: Jun. 3, 2003

(65) Prior Publication Data

US 2004/0105472 A1 Jun. 3, 2004

(30) Foreign Application Priority Data

Nov. 28, 2002 (JP) ........................................ 2002-345572

(51) Int. Cl.⁷ .............................................. H01S 3/04
(52) U.S. Cl. ......................................................... 372/36
(58) Field of Search ............................. 372/36, 43, 65

(56) References Cited

U.S. PATENT DOCUMENTS

| | | | | |
|---|---|---|---|---|
| 5,156,999 A | * | 10/1992 | Lee ............................. 438/25 |
| 5,309,460 A | * | 5/1994 | Fujimaki et al. ............... 372/36 |
| 6,449,296 B1 | * | 9/2002 | Hamasaki et al. ............. 372/36 |
| 6,687,272 B2 | * | 2/2004 | Hamasaki et al. ............. 372/36 |
| 2003/0031217 A1 | * | 2/2003 | Ariyoshi ........................ 372/36 |
| 2003/0108073 A1 | * | 6/2003 | Nishiyama ..................... 372/36 |

FOREIGN PATENT DOCUMENTS

JP     11-66590     3/1999

* cited by examiner

Primary Examiner—Don Wong
Assistant Examiner—Hung Tran Vy
(74) Attorney, Agent, or Firm—Leydig, Voit & Mayer, Ltd.

(57) ABSTRACT

A semiconductor laser apparatus includes a base, a block, and a semiconductor laser element. The base has a recess on a main plane thereof. The block is perpendicularly elongating on the main plane. The block is neighboring the recess. The semiconductor laser element is mounted on a side of the block. A first end of the semiconductor element is located on outer side of the recess, and a second end of the semiconductor element is located on inner side of the recess.

6 Claims, 2 Drawing Sheets

SEMICONDUCTOR LASER DEVICE

BACKGROUND OF THE INVENTION

1. Technical Field of the Invention

The invention relates to a semiconductor laser apparatus including a base, a block perpendicularly elongated on the base, and a semiconductor laser element mounted on the block.

2. Background Art

A semiconductor laser apparatus may be used for a plurality of usages. An optical head provided for optical recording includes a semiconductor laser element, a block, and a base. The block is elongated on the main plane of the base. The semiconductor laser element is mounted on a side of the block. Then, the semiconductor laser element is perpendicular with respect to the main plane of the base. It should be noted that the block and the base are called a stem. A laser beam may be emitted from an emission point of the semiconductor laser element, perpendicular to a plane. Height of the emission point from the main plane of the stem is about 1.27 mm, since the semiconductor laser element has a length of about 1 mm.

Japanese Laid-open Patent Publication No. 9-232684 discloses such a semiconductor laser having a stem and a semiconductor laser element mounted on the stem.

Now, a semiconductor laser element having a shorter wave length and higher power will be developed for high density optical recording. Then, it is required to miniaturize a component housing a semiconductor element, e.g. an optical head. It is also required that the height of the emission point from the surface of the stem should be lower and the height of the stem should be lower.

In order to increase output power of the semiconductor laser element, there is a tendency to increase the length of the resonator of the semiconductor laser element. However, since the semiconductor laser element is mounted on the stem, a semiconductor laser element having a length longer than 1 mm can only be mounted if the height of the emission point is lower than 1 mm.

SUMMARY OF THE INVENTION

It is an object of the invention to provide a semiconductor laser apparatus having a predetermined emission point height independent of the length of the semiconductor laser element.

In accordance with one aspect of the present invention, there is provided a semiconductor laser apparatus including a base, a block, and a semiconductor laser element. The base has a recess on a main plane thereof. The block is perpendicularly elongating on the main plane. The block is neighboring the recess. The semiconductor laser element is mounted on a side of the block. A first end of the semiconductor element is located on outer side of the recess, and a second end of the semiconductor element is located on inner side of the recess.

It is an advantage of the invention that the length of the semiconductor laser element can be longer than the emission height from the main plane, since the recess is provided on the main plane.

BRIEF EXPLANATION OF THE DRAWINGS

The present invention will become readily understood from the following description of preferred embodiments thereof made with reference to the accompanying drawings, in which like parts are designated by like reference numeral, and in which.

DETAILED DESCRIPTION OF THE PREFERRED EMBODIMENTS

Figure 1:
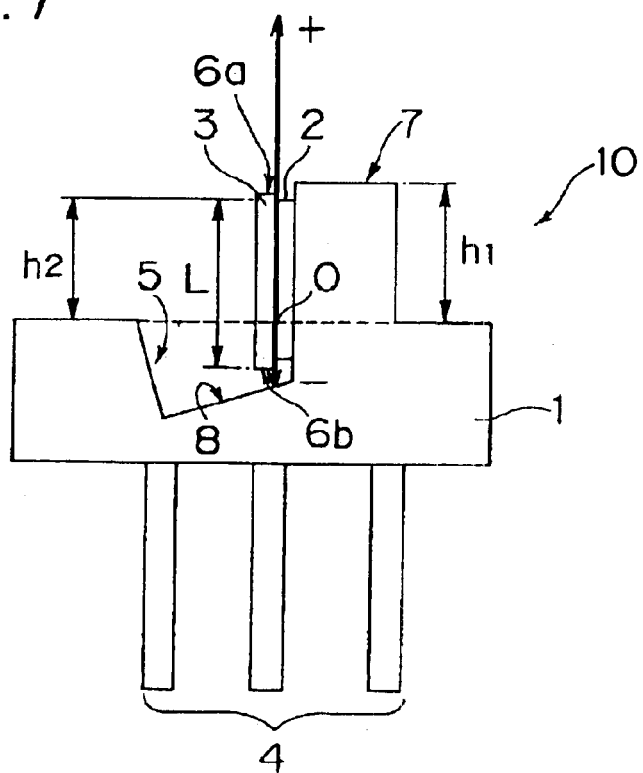
FIG. 1 is a schematic diagram of a semiconductor laser apparatus according to a first embodiment of the present invention.

FIG. 1 is a schematic drawing of a semiconductor laser apparatus 10 according to a first embodiment of the present invention. The semiconductor laser apparatus 10 includes a base 1, a block 7, a sub-mount 2, and a semiconductor laser element 3. The base 1 is thick iron disc having a main plane and a recess 5 provided on the main plane. The recess has a plane on the bottom thereof inclined against the main plane. The block 7 is a rectangular solid and perpendicularly elongating on the main plane. The block 7 is neighboring to the recess 5. The base 1 and the block 7 are combined and called as stem. The sub-mount 2 is perpendicularly mounted on a side plane of the block 7, and the side plane faces the recess 5. The semiconductor laser element 3 is perpendicularly mounted on the sub-mount 2 of aluminum nitride AlN, which is perpendicular to the main plane. The first end 6a of the semiconductor laser element 3 is located on an outer side of the recess, and the second end 6b of the element 3 is located on an inner side of the recess 5.

On an axis perpendicular to the main plane, a crossing point O with the main plane is defined to 0, the inner side of the recess 5 is defined to negative side, the outer side of the main plane is defined to positive side, as shown in FIG. 1. Then, the first end 6a is located on outer side of the recess, i.e. the positive side, and the second end 6b is located on inner side of the recess, i.e. the negative side. Therefore, since the recess 5 is provided, the length L of the semiconductor laser element 3 can be longer than the height h2 of the end 6a of the element 3 from the main plane, as shown in FIG. 1. It is noted that the height h2 is called to as emission point height. Even if the semiconductor laser element having a length longer than h2 will be used, emission point height can be held to h2 and the height of the block 7 can be held to h1. Then, design change of an optical pick-up is not needed, and heat diffusion characteristic of the semiconductor laser apparatus 10 can be prevented to deterioration. Three electrodes 4 connected to the semiconductor laser element 3 perpendicularly provided on another main plane of the base 1.

There is provided a plane 8 inclined against the main plane on the bottom of the recess 5. Laser beam emitted from the another end 6b of the element 3 is reflected on the inclined plane 8 at an angle, so that the laser beam may not return to the end 6b. Since the inclined plane 8 is provided, no external feedback noise is made.

Figure 2:
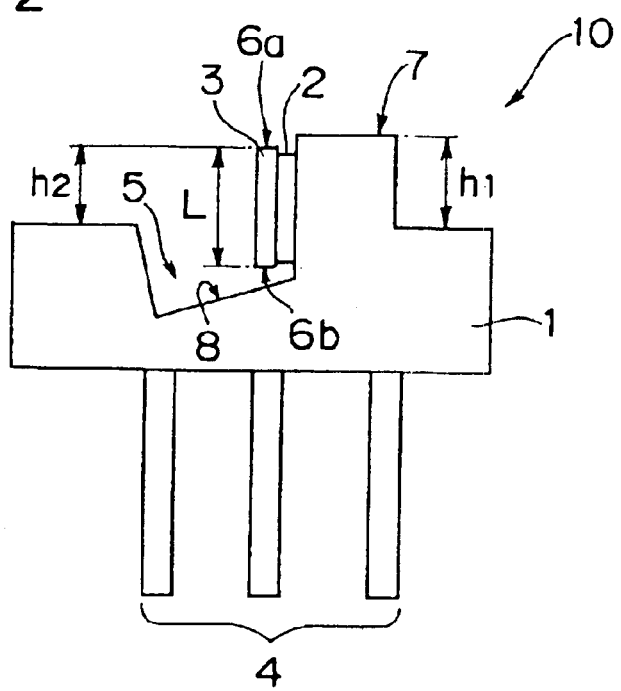
FIG. 2 is a schematic diagram of a semiconductor laser apparatus according to a second embodiment of the present invention.

FIG. 2 is a schematic drawing of a semiconductor laser apparatus 10 according to a second embodiment of the present invention. The apparatus 10 differ from the first embodiment in that the element length L is 1 mm shorter than the first embodiment, and the block 7 height h1 is 1 mm lower than the first embodiment, the emission point height h2 is 0.8 mm lower than the first embodiment. Then, the emission point height h2 is lower than the element length L.

Figure 3:
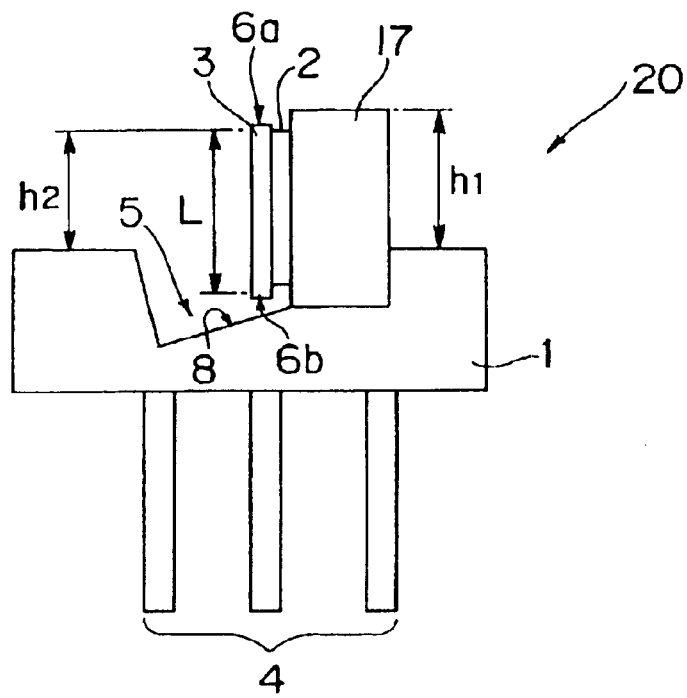
FIG. 3 is a schematic diagram of a semiconductor laser apparatus according to a third embodiment of the present invention.

FIG. 3 is a schematic drawing of a semiconductor laser apparatus 20 according to a third embodiment of the present invention. The apparatus 20 differs from the first embodiment in that a metal block 17 is discrete from the base 1. The metal block 17 may be a copper block having a thermal conductivity higher than that of the base 1. Since the metal block 17 is provided, heat radiation characteristic can be improved.

Figure 4:
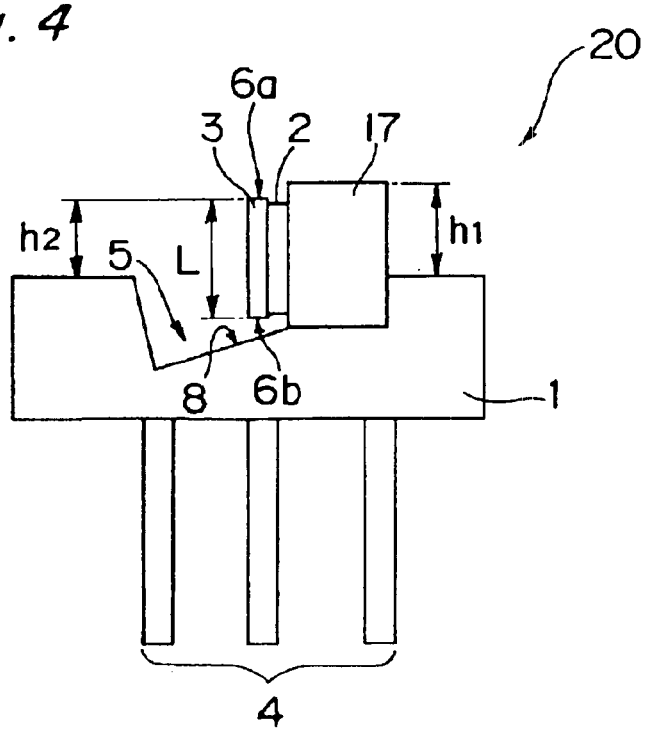
FIG. 4 is a schematic diagram of a semiconductor laser apparatus according to a fourth embodiment of the present invention.

FIG. 4 is a schematic drawing of a semiconductor laser apparatus according to a fourth embodiment of the present invention. The apparatus 20 differ from that of the third embodiment as follows. The element length L is 1 mm shorter than the first embodiment, and the metal block 17 has height h1 1 mm lower than the first embodiment, the emission point height h2 is 0.8 mm lower than that in the first embodiment. Then, the emission point height h2 is lower than the element length L. Since the metal block 17 is provided, heat radiation characteristic can be improved.

Since the recess has a depth, the length L of the semiconductor laser element can be longer than the height h2 of the end 6a of the element from the main plane. Even if the semiconductor laser element having a length longer than h2 will be used, emission point height can be held to h2 and the height of the block can be held to h1. Then, design change of an optical pick-up is not needed, and heat diffusion characteristic of the semiconductor laser apparatus can be prevented to deterioration.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A semiconductor laser apparatus comprising:
   a base having a main planar surface and a recess in the main planar surface;
   a block perpendicular to, in an elongated direction, and on the main planar surface, the block neighboring the recess; and
   a semiconductor laser element mounted on a side of the block, wherein a first end of the semiconductor element is located outside of the recess, and a second end of the semiconductor element is located inside of the recess.

2. The semiconductor laser apparatus according to claim 1, wherein the recess has a planar bottom, facing the second end of the semiconductor and inclined relative to the main planar surface.

3. The semiconductor laser apparatus according to claim 1, wherein the block and base are combined.

4. A semiconductor laser apparatus comprising:
   a base having a main planar surface and a recess extending into the base from the main planar surface;
   a block extending perpendicular to the main planar surface in a direction opposite from the recess, the block neighboring the recess; and
   a semiconductor laser element mounted on a side surface of the block and emitting light from a light emitting surface that is generally parallel to the side surface of the block, and having opposed first and second ends transverse to the light emitting surface, wherein the first end of the semiconductor element is located outside of the recess and the second end of the semiconductor element is located within the recess.

5. The semiconductor laser apparatus according to claim 4, wherein the recess has opposed first and second side surfaces generally transverse to the main planar surface and a planar bottom surface joining the first and second side surfaces of the recess, and
   the planar button surface faces the second end of the semiconductor laser element and is inclined relative to the main planar surface.

6. The semiconductor laser apparatus according to claim 4, wherein the block and base are a single continuous material.

* * * * *

UNITED STATES PATENT AND TRADEMARK OFFICE
CERTIFICATE OF CORRECTION

PATENT NO. : 6,901,093 B2
DATED : May 31, 2005
INVENTOR(S) : Hosokawa et al.

It is certified that error appears in the above-identified patent and that said Letters Patent is hereby corrected as shown below:

<u>Title page,</u>
Item [54], Title, should read -- SEMICONDUCTOR LASER APPARATUS --.

Signed and Sealed this

Thirteenth Day of June, 2006

JON W. DUDAS
*Director of the United States Patent and Trademark Office*